United States Patent [19]
Younan et al.

[11] Patent Number: 5,437,735
[45] Date of Patent: Aug. 1, 1995

[54] PHOTOVOLTAIC SHINGLE SYSTEM

[75] Inventors: Kais Younan, Troy; David Wolf, Clawsen; Mark Lycette, Berkley; Troy Glatfelter, Royal Oak; Kevin Hoffman, Sterling Heights; Arindam Banerjee, Madison Heights, all of Mich.

[73] Assignee: United Solar Systems Corporation, Troy, Mich.

[21] Appl. No.: 175,968

[22] Filed: Dec. 30, 1993

[51] Int. Cl.⁶ .................. E04D 13/18; H01L 31/042
[52] U.S. Cl. .................................... 136/251; 136/244; 136/291; 52/173.3
[58] Field of Search .............. 136/244, 251, 291; 52/173.3

[56]  References Cited
U.S. PATENT DOCUMENTS

| | | | |
|---|---|---|---|
| 3,087,309 | 4/1963 | Toulmin, Jr. | 62/3.2 |
| 3,369,939 | 2/1968 | Myer | 136/246 |
| 3,459,597 | 8/1969 | Baron | 136/244 |
| 3,769,091 | 10/1973 | Leinkram et al. | 136/246 |
| 3,841,302 | 10/1974 | Falbel | 126/606 |
| 4,040,867 | 8/1977 | Forestieri et al. | 136/244 |
| 4,189,881 | 2/1980 | Hawley | 52/91.3 |
| 4,321,416 | 3/1982 | Tennant | 136/244 |
| 4,336,413 | 6/1982 | Tourneux | 136/251 |
| 4,860,509 | 8/1989 | Laaly et al. | 52/173.3 |
| 4,936,063 | 6/1990 | Humphrey | 52/200 |
| 5,092,939 | 3/1992 | Nath et al. | 136/251 |
| 5,112,408 | 5/1992 | Melchior | 136/251 |
| 5,232,518 | 8/1993 | Nath et al. | 136/251 |

FOREIGN PATENT DOCUMENTS

| | | | |
|---|---|---|---|
| 61-287277 | 12/1986 | Japan | 136/291 |
| 61-287288 | 12/1986 | Japan | 136/291 |
| 4-278588 | 10/1992 | Japan | 136/251 |

*Primary Examiner*—Aaron Weisstuch
*Attorney, Agent, or Firm*—Gifford, Krass, Groh, Sprinkle, Patmore, Anderson & Citkowski

[57]  ABSTRACT

A photovoltaic roofing shingle includes a strip of roofing material having an overlap portion, and a plurality of tab portions depending therefrom. Each of the tab portions includes a photovoltaic generating device affixed thereto. The photovoltaic devices are electrically interconnected, and each photovoltaic shingle member includes a pair of electrical terminals for delivering power from said photovoltaic devices. In use, the shingle members are affixed to a roof so that the tab portions of one row of shingles cover the overlap portion of an adjoining row. Electrical interconnection may be made through the roof to the inside of the building, or to a point atop the roof.

20 Claims, 5 Drawing Sheets

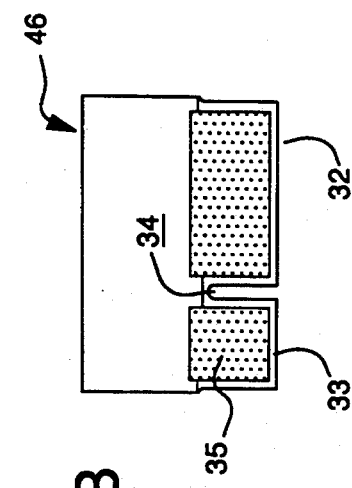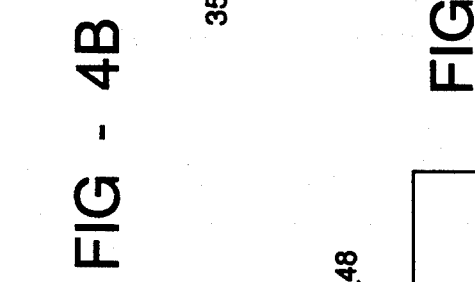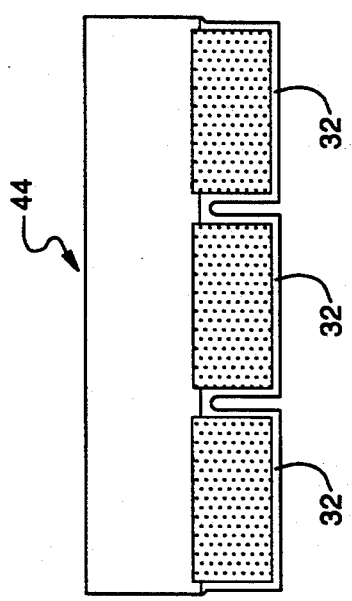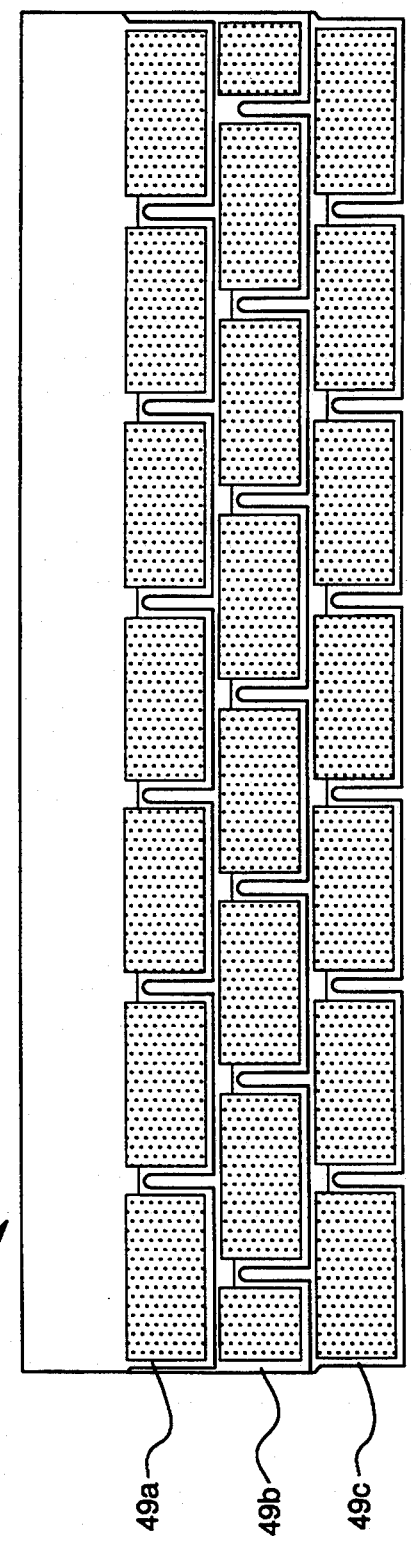

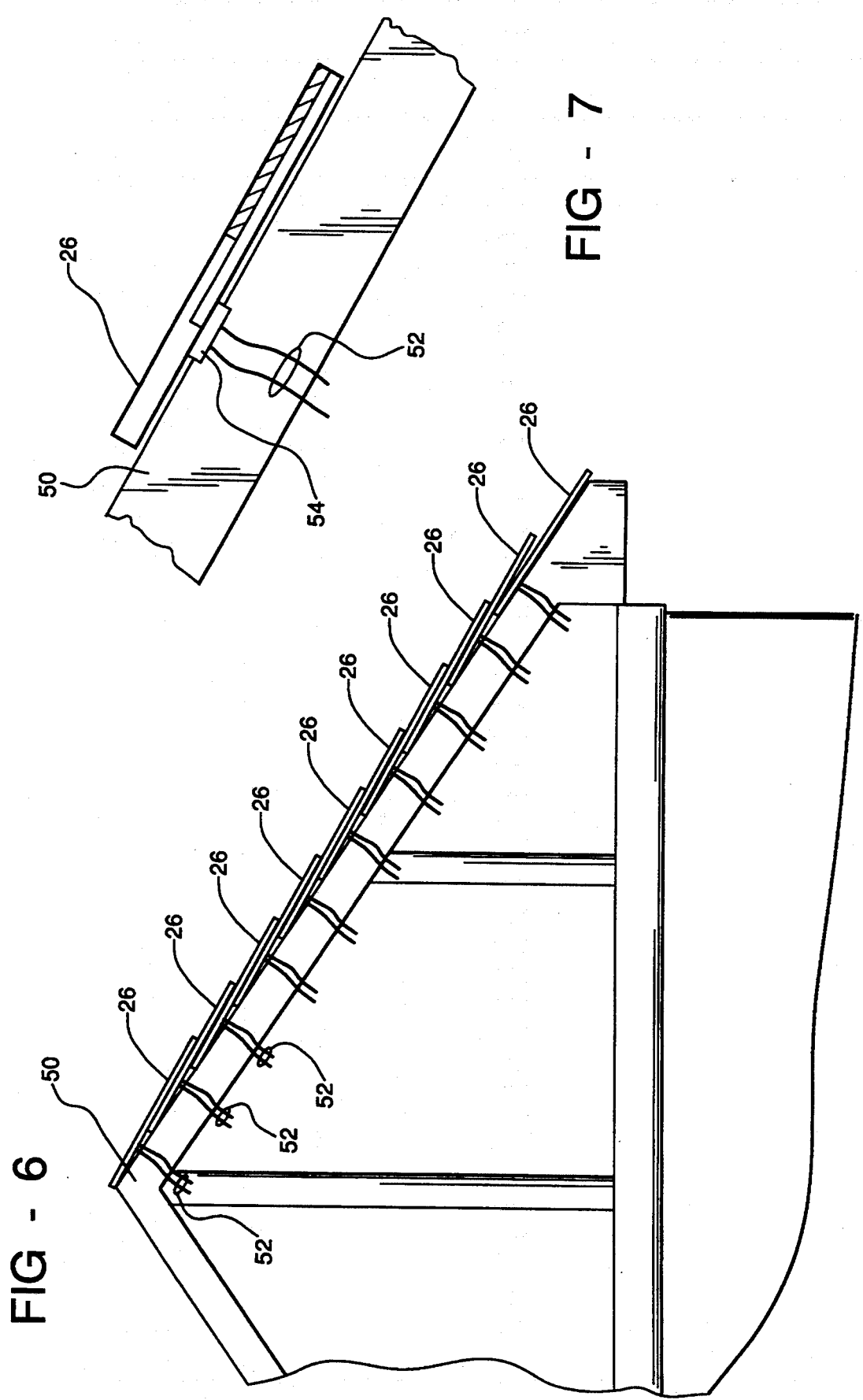

PHOTOVOLTAIC SHINGLE SYSTEM

FIELD OF THE INVENTION

The invention relates generally to photovoltaic devices and more particularly to a roofing material which is capable of generating electrical power. Most specifically, the invention relates to a roofing shingle structure which is compatible with conventional shingles and which is capable of generating electrical power.

BACKGROUND OF THE INVENTION

Photovoltaic energy is becoming a very significant source of electrical power. This is because problems of scarcity and safety have limited the use of fossil and nuclear fuels, and recent advances in photovoltaic technology have made possible the large scale manufacture of low cost, light weight, thin film photovoltaic devices. It is now possible to manufacture large scale, thin film silicon and/or germanium alloy materials which manifest electrical and optical properties equivalent, and in many instances superior to, their single crystal counterparts. These alloys can be economically deposited at high speed over relatively large areas and in a variety of device configurations, and as such they readily lend themselves to the manufacture of low cost, large area photovoltaic devices. U.S. Pat. Nos. 4,226,898 and 4,217,364 both disclose particular thin film alloys having utility in the manufacture of photovoltaic devices of the type which may be employed in the present invention. However, it is to be understood that the present invention is not limited to any particular class of photovoltaic materials and may be practiced with a variety of semiconductor materials including crystalline, polycrystalline, microcrystalline and noncrystalline materials.

The power generated by a photovoltaic device is proportional to the illumination incident thereupon and if relatively large amounts of power are to be generated, fairly large collection areas are required. The roof and upper story areas of building structures are well illuminated and are generally not put to productive use. For some time now it has been known to place photothermal and photovoltaic collectors on the top portions of buildings. Roof mounted photovoltaic devices are shown for example in U.S. Pat. Nos. 5,092,939; 5,232,518 and 4,189,881. These particular photovoltaic roofing structures are of the batten and seam type.

In many instances shingled roofs are favored, typically for residential construction, and in those instances where fairly complex roof geometries are encountered. In a typical shingle construction, roofing material is supplied in rolls, or in precut pieces which are subsequently laid in an overlapping configuration. In some instances, roofs are shingled with relatively thick tiles, which may be planar or of a curved cross-section. It will be appreciated that there is a need for integrating photovoltaic power generation with shingled roof constructions.

U.S. Pat. No. 4,040,867 describes a photovoltaic shingle construction comprised of a plurality of individual shingle members, each of which has a number of electrically interconnected single crystal photovoltaic devices thereupon. In order to obtain high power from this type of device, either the individual shingle must be made larger, or several shingles need to be electrically interconnected. The first approach presents problems of windloading; and the second approach results in a construction requiring a large number of weatherproof electrical interconnections; also, leakage can result because of moisture creep between adjacent shingles by capillary action. Another configuration of photovoltaic shingle is described in U.S. Pat. No. 4,321,416. U.S. Pat. No. 3,769,091 depicts yet another photovoltaic roofing system comprised of a number of individual silicon devices mounted in an overlapping relationship.

The prior art has not been able to provide an acceptable shingle type photovoltaic roofing system. Prior art devices are generally thick, inflexible, or of a geometry which makes them incompatible with standard construction techniques. As a result, prior art photovoltaic shingle structures require specialized installation techniques and trained personnel, which increases their cost and limits their utility. Furthermore, such structures cannot be easily integrated into a conventionally constructed roof. In addition, prior art photovoltaic roofing structures present aesthetic problems since the devices are often of a distinctive color, or of a geometry such that they are very obvious when installed.

Clearly, it would be desirable to have a photovoltaic roofing material which is as much like conventional roofing material as possible. The photovoltaic portion of the roofing material should be self contained to a large degree and be easily installed by conventional techniques. It should also be relatively lightweight, resistant to wind loading and stable under harsh atmospheric conditions.

The present invention, as will be described in further detail herein below, provides a roofing material which incorporates photovoltaic technology into conventionally configured shingle stock. The roofing material of the present invention is simple to install and efficiently converts light to electricity, and may be used in combination with standard, non-photovoltaic shingle stock to cover any desired portion of a roof. The particular configuration of the present invention makes efficient use of roof space for generating electricity and is unobtrusive in use. These and other advantages of the present invention will be readily apparent from the drawings, discussion and description which follow.

BRIEF DESCRIPTION OF THE INVENTION

There is disclosed herein a photovoltaic roofing member which comprises a strip of roofing material having a length "$L_s$" and a width "$W_s$." The strip includes an overlap portion having a length "$L_o$" which is equal to $L_s$ and a width "$W_o$," which is less than $W_s$. The strip also includes a plurality of tab portions depending from the overlap portion. The tab portions are defined by at least one notch which is cut part way through the width of the strip. Each tab has a length "$L_t$" which is less than $L_s$ and a width "$W_t$" which is less than $W_s$, such that $W_t$ plus $W_o$ equals $W_s$. The roofing member further includes a plurality of photovoltaic devices, each affixed to a corresponding one of said tabs. Each photovoltaic device includes a positive electrode, a negative electrode, and a body of photovoltaic material disposed there between. Each device is operative to generate a flow of electrical current between the electrodes in response to the absorption of photons by the body of photovoltaic material. The roofing member also includes an interconnect system for establishing electrical communication between the plurality of photovoltaic devices, as well as a positive electrical terminal and a negative electrical terminal disposed in electrical communication with the interconnected devices. The terminals permit connection of the photovoltaic roofing member to a load.

In particular embodiments, the strip of roofing material comprises a matrix of an organic, polymeric material having a body of fibrous material therein. The polymeric matrix may comprise an asphalt based matrix and the fibers may comprise glass fibers. The tabs may include further elements such as stiffener elements fixed thereto and/or a body of sealant material. The front and/or back surface of the photovoltaic device may be encapsulated by a protective material. One particularly preferred type of photovoltaic device comprises a flexible, thin film photovoltaic device such as a silicon-hydrogen alloy based device.

The interconnect system may comprise a set of jumper wires for establishing a series, parallel, or mixed series/parallel electrical connection between the photovoltaic devices. In one embodiment, the terminals are disposed on the back side of the roofing member so as to permit electrical current to be fed through, and to the bottom side of a supporting roof structure.

BRIEF DESCRIPTION OF THE DRAWINGS

FIGS. 4A-C are top plan views of other configurations of shingles structured in accord with the principles of the present invention;

FIG. 5 is a top plan view of a portion of a roof covered with the photovoltaic shingles of the present invention;

FIG. 6 is a side elevational view of a house, having one end cut away, and including the photovoltaic shingles of the present invention;

FIG. 7 is a cross-sectional view of one photovoltaic shingle of the present invention shown affixed to a roof;

DETAILED DESCRIPTION OF THE INVENTION

The present invention is directed to a roofing shingle which generates photovoltaic power. It is to be understood that the present invention may be practiced in connection with a variety of differently comprised and configured photovoltaic devices. Thin film photovoltaic devices are low cost and light weight and can be fabricated upon flexible substrates and comprise one particularly preferred group of devices which may be used in the practice of the present invention. One particularly preferred group of thin film photovoltaic devices comprises those fabricated from alloys of group IVa semiconductor materials, particularly silicon-hydrogen and germanium-hydrogen alloys; although, it is to be understood that the present invention may also be practiced in connection with other thin film materials such as CdS, CuInSe$_2$, and GaAs as well as single crystalline, polycrystalline, and microcrystalline photovoltaic materials.

Figure 1:
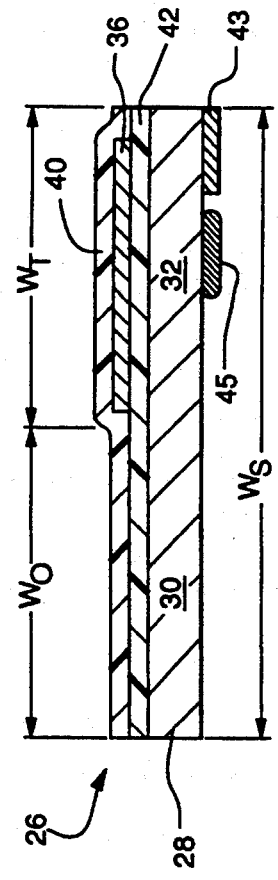
FIG. 1 is a cross-sectional view of a photovoltaic device of the type which may be employed in the practice of the present invention.

Referring now to FIG. 1, there is shown, in cross-section, one particularly preferred photovoltaic device 10, which may be employed in the practice of the present invention. The device 10 of FIG. 1 is a tandem NIP type photovoltaic device made up of a plurality of individual n-i-p type cells 12a, 12b, and 12c disposed in an optical and electrical series relationship between a substrate electrode 11 and a top electrode 22. The substrate 11 is preferably formed from a thin, electrically conductive material such as a layer of stainless steel, aluminum, or the like. In some instances, the substrate 11 may comprise a body of insulating material such as glass, or a polymeric material, having an electrically conductive layer deposited thereupon. In some instances, the substrate 11 includes a back reflector deposited thereupon. The back reflector may be a single or multiple layered structure which has a top surface that is smooth or textured, and serves to increase the efficiency of the device by reflecting unabsorbed light back through the overlying semiconductor layers. It is to be understood that within the context of this disclosure, the terms substrate, or substrate electrode shall refer to any assemblage of layers which support the remaining portion of the photovoltaic device and provide a bottom electrode thereof.

Each of the cells 12a, 12b, and 12c includes at least one layer of a hydrogenated group IVa semiconductor material. As illustrated, each of the cells 12a, 12b, and 12c includes a layer of p type semiconductor material 20 and a layer of n type semiconductor material 16, with a layer of substantially intrinsic semiconductor material 18 interposed therebetween. In some instances, the intrinsic layer 18 may be of slightly p or n type conductivity; however, with regard to the doped layers, it is essentially electrically neutral, and is referred to herein as being a substantially intrinsic layer. In the illustrated embodiment, the structure includes three stacked cells 12a, 12b, and 12c. It is to be understood that a greater or lesser number of cells may be similarly disposed.

Atop the uppermost cell 12c is a top electrode 22. This electrode is fabricated from a transparent, electrically conductive material, typically a transparent conductive oxide (TCO) such as tin oxide, indium oxide, indium tin oxide, zinc oxide, cadmium stannate, or combinations thereof. Generally, an electrode grid 24 is disposed atop the TCO layer 22 to enhance the collection efficiency of photogenerated current. In some embodiments, the intrinsic layers 18 of each of the cells 12a, 12b, 12c are formed from semiconductor alloy materials having different band gaps, so as to make maximum use of incident illumination. For example, the intrinsic layer 18 of cell 12c may have a band gap of approximately 1.7 eV; the intrinsic layer 18 of cell 12b may have a band gap of approximately 1.5 eV, and the intrinsic layer 18 of cell 12a may have a band gap of approximately 1.3 eV. Such tandem devices, and methods for their fabrication are well known in the art.

Figure 2:
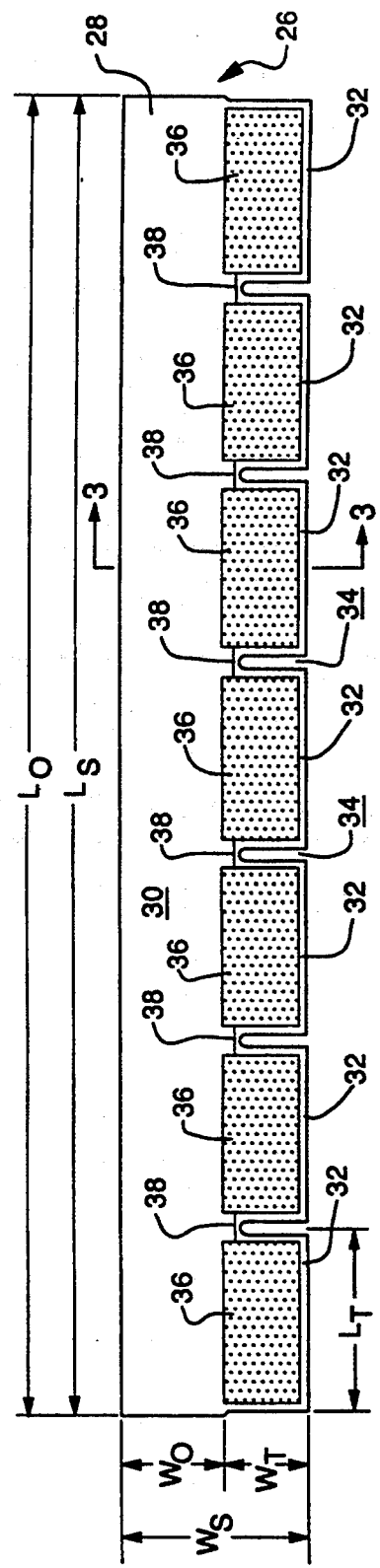
FIG. 2 is a top plan view of one embodiment of photovoltaic shingle structured in accord with the principles of the present invention.

Referring now to FIG. 2, there is shown a top plan view of a photovoltaic roofing member 26 configured as a strip of shingle material in accord with the principles of the present invention. The roofing member 26 comprises a strip of roofing material 28 of a generally rectangular, elongated shape having a length $L_s$ which is greater than its width $W_s$. The strip of roofing material 28 is configured to define a plurality of portions. The first portion is a generally rectangular overlap portion 30 which has a length $L_o$ coextensive with the length $L_s$ of the strip 28, and a width $W_o$ which is less than the width $W_s$ of the strip 28. Depending from the overlap portion 30 are a number of separate tab portions 32. The tab portions are defined by one or more notches 34 which are cut part way through the width $W_s$ of the strip 28. The tabs each have a length $L_t$ which is less than the length $L_s$ of the strip and a width $W_t$ which is less than the width $W_s$ of the strip. The width of the tabs and the width of the overlap portion are such that $W_o$ plus $W_t$ equals $W_s$. It will be noted that in the illustrated embodiment, the notches 34 do not extend the full width $W_t$ of the tabs; however, in accord with the present invention, the notches 34 may be made longer or shorter. Also, the tabs 32 are shown as being rectangular; it is to be understood that aesthetic considerations may dictate that the free ends thereof be configured in another shape such as a different polygonal shape or a curved shape.

Disposed upon a top surface of each tab portion 32 is a photovoltaic device 36. As discussed hereinabove, the devices 36 may be of various materials and configurations, and in one preferred embodiment they are thin film devices fabricated from group IVa semiconductor alloys. Each of the photovoltaic devices 36 includes a top and a bottom electrode as discussed above, and is operative to absorb incident illumination and provide a flow of current between said electrodes in response thereto.

The photovoltaic roofing member 26 of FIG. 2 further includes an interconnect system for establishing electrical communication between the photovoltaic devices 36. As illustrated, this interconnect system includes a number of jumpers 38 joining the devices 36. The jumpers 38 may comprise cables, wires, or tapes fabricated from copper or some other such material with good electrical conductivity. As is well known in the art, the devices 36 may be interconnected in a series configuration, a parallel configuration, or a mixed series-parallel configuration. By appropriately configuring the interconnections, current and voltage of the resultant combination may be controlled. In some instances, it may be desirable to dispose the jumpers 38 comprising the interconnect system so that they extend further into the overlap portion 30 of the strip 28, so that they will be covered by adjoining shingles when in use. In other instances, interconnection may be accomplished from the rear surface of the roofing member 26. The roofing member 26 also includes a positive and a negative electrical terminal for withdrawal of power therefrom. The terminals are in electrical communication with the interconnected plurality of photovoltaic devices.

Figure 3:
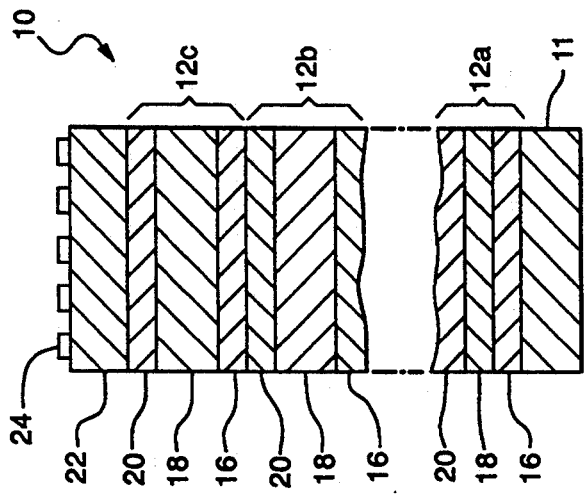
FIG. 3 is a cross-sectional view of the shingle of FIG. 2 taken along line III—III.

Referring now to FIG. 3, there is shown a cross-sectional view of the roofing member 26 of FIG. 2 taken along line 3—3. Visible in the figure is the strip of roofing material 28 showing the overlap portion 30 and tab portion 32, together with the photovoltaic device 36 as disposed upon the tab portion 32. In the illustrated embodiment, the photovoltaic device includes a top layer of protective material 40 disposed thereupon. This protective layer 40 is shown as extending across the entire top (i.e., light incident) surface of the photovoltaic device 36 and onto the overlap portion 30 of the strip 28 of roofing material. The protective layer 40 is optional, and serves to protect the photovoltaic device 36 from ambient atmospheric conditions. The protective layer 40 is preferably an inert, optically transparent material. Fluoropolymers comprise one preferred group of protective materials, and a material sold by the du Pont Corporation under the tradename Tefzel has been found to be advantageous. The protective layer is typically adhered to the photovoltaic device with a bondable material such as an ethylene vinyl acetate (EVA). In the illustrated embodiment, the top protective layer 40 covers the photovoltaic device 36 and the remainder of the tab 32 as well as all of the overlap portion 30. In some embodiments, a top protective layer may cover only the photovoltaic device, or it may cover the device and only a portion of the strip 28. In the illustrated embodiment, a bottom protective layer 42 is also included. This layer is generally similar to the top protective layer; however, optical transparency is not necessary; and hence, opaque materials may be employed. Typically, the bottom protective layer, if utilized, comprises a polymeric material. The strip 28 is preferably fabricated from standard roofing stock, and as such comprises a fibrous material such as glass fiber, ceramic fiber, vegetable fiber, or synthetic polymeric fiber disposed in a moisture resistant matrix. The matrix typically comprises an organic polymeric material of natural origin such as asphalt, pitch, rubber or the like, or it may comprise a synthetic polymeric material. In some instances, the strip 28 of roofing material may comprise a multilayered composite. In general, any roofing material known in the art may be adapted for use in the present invention.

The roofing member may optionally include a stiffening member 43 disposed along the free edge of the tab portion 32. The stiffening member 43 is formed from a rigid material, such as a metal or polymeric strip, and it serves to prevent excessive longitudinal flexing of the tab 32. The roofing member 26 may also include a body of sealant 45 on the bottom side of the tab 32. The sealant is typically a thermoplastic, contact adhesive material such as a tar, asphalt, or synthetic polymer based material, and it serves to adhere the tab 32 to an underlying shingle. As is known in the art, the body of sealant 45 may be protected by a strip of release paper or the like.

Depending upon the particular application, the roofing member of the present invention may be manufactured in a variety of configurations. Referring now to FIGS. 4A–4C there are shown some such variations. FIG. 4A shows a roofing member 44 including three tabs 32 of approximately equal lengths. FIG. 4B shows a roofing member 46 which includes only two tabs 32 and 33 defined by a single notch 34. It should be noted that tab 33 is of a smaller length than tab 32, and includes a correspondingly smaller photovoltaic device 35 thereupon. FIG. 4C shows yet another configuration of roofing member 48 which includes three tabs. Two of the tabs 32 are of approximately equal length and the third tab 33 is a smaller tab. In FIG. 4C, the small tab is on the right side of the roofing member 48, and in the FIG. 4B embodiment, the small tab is on the left side thereof. It will be appreciated that through the use of the variously configured members illustrated herein, differing areas and shapes of roofs may be effectively covered.

The roofing members of the present invention are installed in the manner of conventional strip shingle material; that is to say, a first row of members is attached to a roof by nailing through the overlap portion thereof. A second row is affixed in place so that the tab portions thereof overlap, and cover the majority of the overlap portion of the first row. Succeeding rows are laid in the same manner. By the use of appropriately shaped pieces at the ends thereof, a uniform area may be effectively covered.

Referring now to FIG. 5, there is shown a portion 47 of a roof having three rows, 49a, 49b, and 49c, of shingle material of the present invention installed thereupon. It will be noted that the appearance is comparable to that of a standard shingled roof and the presence of the photovoltaic device, and any optional encapsulant layer, further enhances the durability of the shingles. It has been found that by appropriately control of the thickness, and in some instances the stoichiometry, of the TCO layer of the photovoltaic device, the perceived color of the device may be controlled so as to match the remainder of the roof. Because of the fact that the shingles of the present invention are similar in appearance and method of installation, to conventional shingle material, they may be inconspicuously integrated into conventionally constructed roofs without the need for any specialized tools or labor.

Referring now to FIG. 6, there is shown a side elevational view of a building having a portion of the roof 50 thereof covered with a number of strips of photovoltaic shingles 26 of the present invention. FIG. 6 illustrates the manner in which the photovoltaic shingles are affixed in an overlapping relationship. It will also be noted that the figure shows a number of electrical terminal pairs 52 projecting through the roof 50 to the interior of the building. Each of these terminal pairs 52 is in electrical communication with the interconnected photovoltaic devices of each strip 26 and thereby provides a positive, and a negative electrical terminal for withdrawal of power therefrom. The individual terminal pairs 52 may be electrically interconnected to a load or to a power storage system.

Referring now to FIG. 7, there is shown a sectional view of a portion of the roof 50 showing one photovoltaic shingle member 26 affixed thereto. It will be seen that the terminal pair passes through the roof 50 from a junction box 54 on the rear surface of the shingle member 26. In keeping with the present invention, a body of caulking or sealing material may be further included with the junction box 54 to seal the opening through the roof. In another embodiment, the electrical leads coming out of the strip of roofing material 26 can be a pair of electrically insulated wires. The insulation extends to the photovoltaic devices and is completely covered by the rear surface laminate. The junction box is eliminated, and the material presents a flat rear surface. Since the junction box is eliminated, the wires may be passed through the roof through a relatively small sized hole, having a diameter comparable to that of a nail hole used to fasten the shingle to the roof. This approach can eliminate the need for caulking material. In some instances, it may not be possible, or desirable to bring electrical connections in through the roof, and such instances, the terminals may be otherwise placed on the shingle, as for example on the front surface, or at the edge.

The foregoing embodiments were directed to shingle structures for providing a relatively planar roof surface. In some instances, tiled roof structures are employed, and these tiles frequently have curved cross sections. Accordingly, it is desirable to have a photovoltaic roofing material which is compatible with curved tile roofs. In accord with another embodiment of the present invention, there is provided a shingle structure which may be integrated with variously curved roofing tiles.

Figure 8:
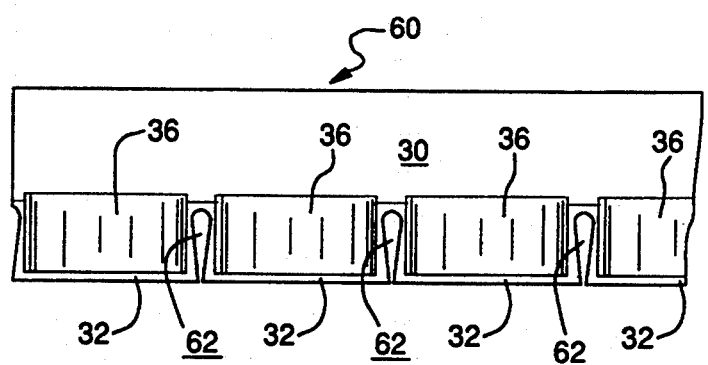
FIG. 8 is a top plan view of another embodiment of photovoltaic shingle structured in accord with the principles of the present invention.

Referring now to FIG. 8, there is shown a portion of a photovoltaic roofing member 60 which is configured to be employed in combination with curved roofing tiles. The member 60 is generally similar to the members previously described, and includes an overlap portion 30 and a plurality of separate tab portions 32, each of which has a photovoltaic device 36 disposed thereupon. As in the previous embodiments, each tab 32 is defined by at least one notch 62.

Figure 11:
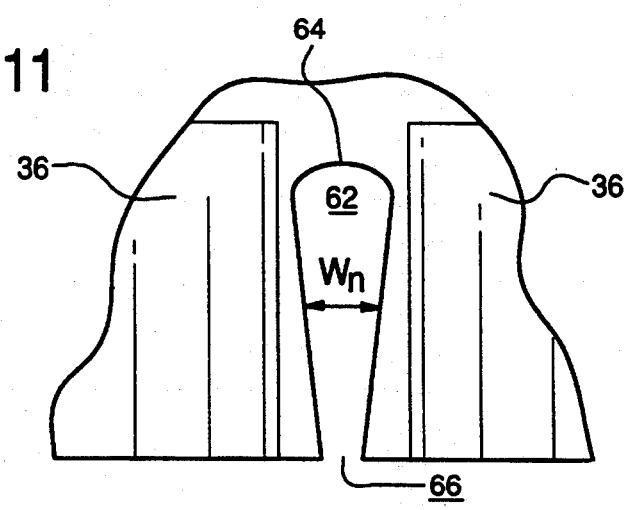
FIG. 11 is an enlarged view of a portion of the shingle structure of FIG. 8 illustrating the tapered notch thereof.

As is best shown in FIG. 11, each notch 62 of the FIG. 8 embodiment, is a tapered notch, and within the context of this disclosure, a tapered notch is defined as a notch having two nonparallel sides defining the length thereof. As such, it is to be contrasted to a straight, or parallel notch, in which the two sides defining the length are parallel. It is to be noted that the notch in FIG. 11 is tapered so that the width "$W_n$" thereof varies and is greatest proximate the root end 64 of the notch 62, and is smallest proximate the free end 66 of the notch 62.

The tapered notches 62 permit the tabs 32 of the shingle structure 60 of FIG. 8 to be curved when the shingles are installed on a roof so that the resultant structure is simulative of, and compatible with, roofs made of curved tiles.

Figure 9:
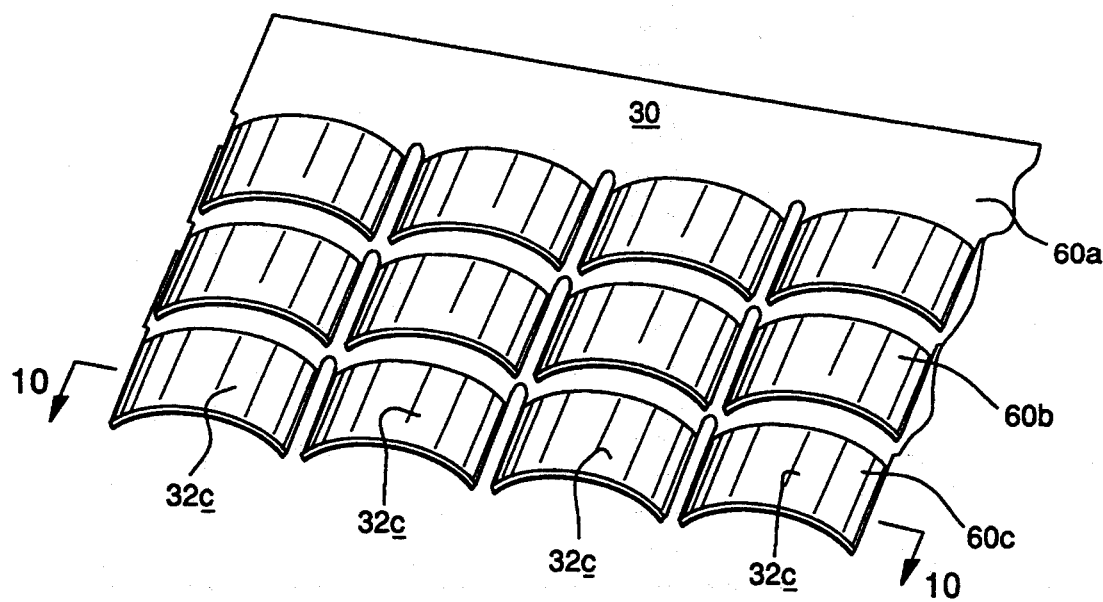
FIG. 9 is a perspective view of a portion of a roof covered with the photovoltaic shingles of FIG. 8.
Figure 10:
FIG. 10 is a cross-sectional view of the roof of FIG. 9 taken along line 9—9.

Referring now to FIG. 9, there is shown a portion of a roof covered with the shingles of FIG. 8. Illustrated therein are three strips 60a, 60b, 60c and it will be noted that the tab portions 32 thereof are curved in this installation, although the overlap portion, 30 of 60a remains flat, and provides a base for the tab portions of adjacent shingles, for example, 60b. In installations of this type, the shingles are installed so that the tabs on adjacent strips are aligned. It will be noted that the curvature of the tabs varies, and is greatest proximate the free end thereof, and decreases as the tab approaches the overlap portion 30. FIG. 10 is a cross-sectional view of the roofing structure of FIG. 9 taken along line 9—9 showing four tabs 32c of the shingle 60c, and illustrating the curvature thereof.

Figure 12:
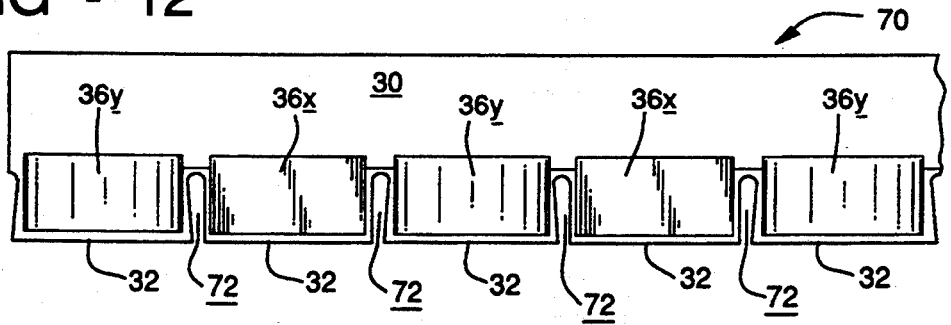
FIG. 12 is a top plan view of another embodiment of shingle structured in accord with the principles of the present invention.

Other configurations of shingle for use in combination with curved tile roofs are possible in accord with the present invention. In some instances, roofs are fabricated from alternating rows of curved and flat tiles, and FIG. 12 illustrates yet another shingle structure 70 in accord with the present invention. The shingle 70 of FIG. 12 includes an overlap portion 30 and a plurality of tabs 32, with photovoltaic devices 36 attached thereto, as previously described. The tabs are defined by a plurality of notches 72, which in this embodiment are tapered notches of a particular configuration.

Figure 15:
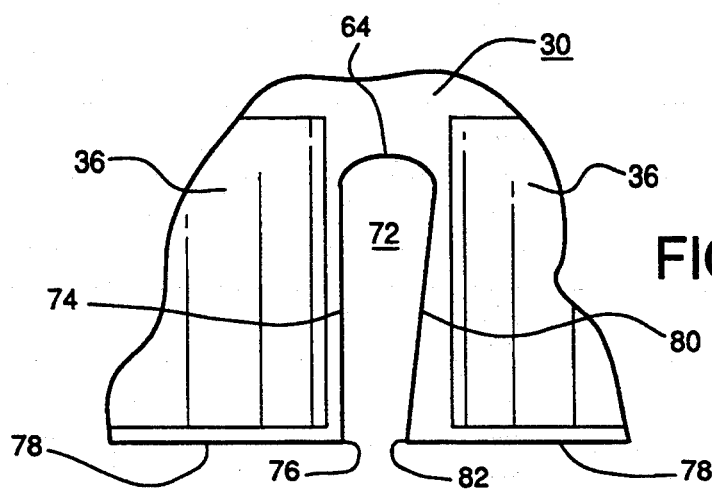
FIG. 15 is an enlarged view of a portion of the shingle of FIG. 12 illustrating the tapered notch thereof.

Referring now to FIG. 15, there is shown an enlarged view of a portion of the shingle 70 of FIG. 12, better illustrating the tapered notch 72 thereof. The notch 72 is tapered, as previously described and as such includes two non-parallel sides along the length thereof and the taper is disposed so that width of the notch is greatest proximate the root end 64 thereof. It will be noted from the figure that the notch 72 is configured so that one of the sides 74 thereof forms a corner 76 with the free edge 78 of the tab 32, which corner is a right angled corner. A second edge 80 forms a corner 82 with a free edge 78 of an adjoining tab, which corner 82 is an acutely angled corner.

Referring back to FIG. 12, it will be noted that the notches 72 may be configured so that alternating tabs are bounded by right angled corners 76 and acutely angled corners 82 respectively. The tabs having right angled corners, for example tabs 36-x, will lie flat when the shingle 70 is installed and those tabs, for example tabs 36-y with acutely angled corners will curve.

Figure 13:
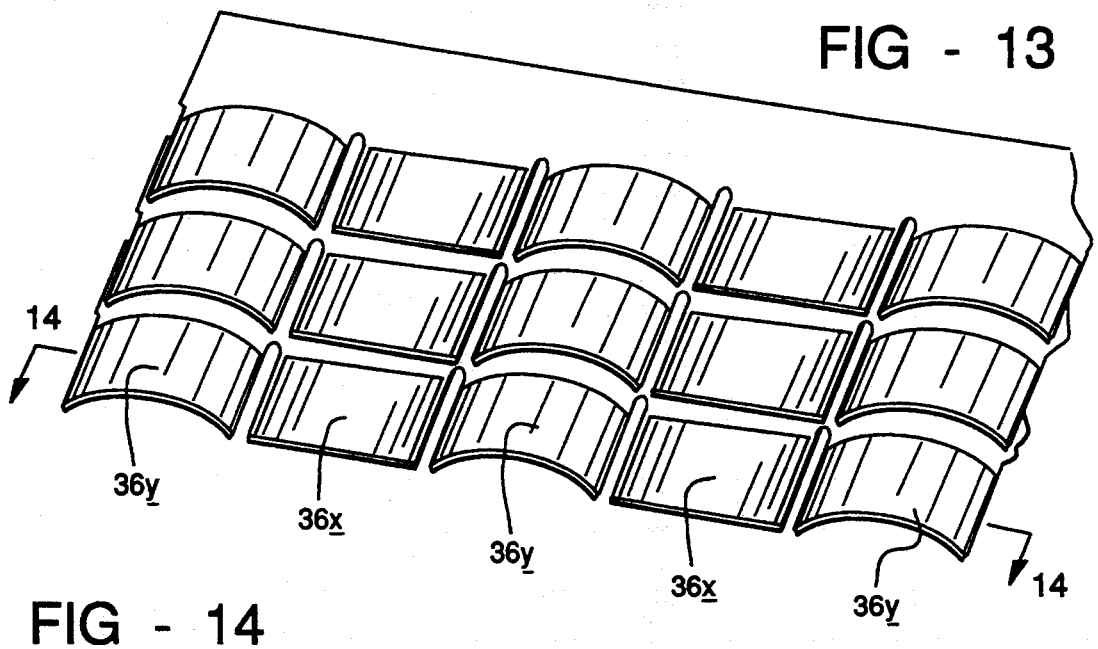
FIG. 13 is a perspective view of a portion of a roof covered with the shingles of FIG. 12.

Referring now to FIG. 13, there is shown a perspective view of a portion of a roof installation employing the shingles 70 of the present invention. It should be noted that the particular configuration of the notches provides for alternating flat and curved rows.

Figure 14:
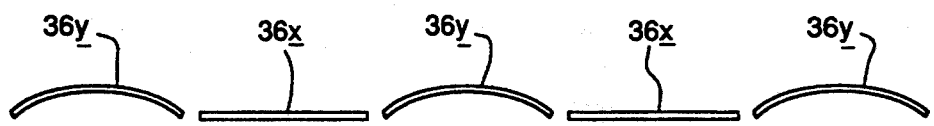
FIG. 14 is a cross-section of the roof of FIG. 13 taken along line 14—14.

FIG. 14 is a cross-sectional view taken along line 14—14 and illustrating the curved, 36-y and flat, 36-x tabs. In keeping with these general principles, various other configurations of flat and curved shingle structures may be prepared.

In instances where roofs are configured to include dormers and other such structures, the intersection between the dormer and the gable will form a compound angle. Mounting of the roofing material of the present invention may be accomplished by either preconfiguring one of the edges of the roofing material so that the photovoltaic cell on the tab portion thereof is cut at an angle which will permit the strip to be fitted to the dormer. In other instances, the end tab of the strip is free of active photovoltaic material, and as such may be custom cut in the field to permit fitting of the roof material to permit flush mounting along the intersection line.

It will thus be appreciated that the shingle construction of the present invention provides for roof top mounted photovoltaic generating units which are inconspicuous, light in weight and easy to install. Because of its particular configuration, the photovoltaic material, in addition to providing electrical generating capacity, provides a durable high quality roof. The combination of overlap and tab portions allows for ready integration with conventional roofing systems and provides a weather tight, wind resistant construction. The presence of the photovoltaic devices actually enhances the strength and durability of the roofing material.

While the foregoing invention was primarily described with reference to particular embodiments, it will be understood that numerous other variations will be readily apparent to one of skill in the art from the drawings, discussion and description of the particular embodiments presented herein. Therefore, it is the following claims, including all equivalents, which define the scope of the invention.

We claim:

1. A photovoltaic roofing member comprising:
    a strip of roofing material having a length "$L_s$" and a width "$W_s$," said strip including an overlap portion having a length "$L_o$," which is equal to $L_s$ and a width "$W_o$," which is less than $W_s$, said strip further including a plurality of tab portions depending from the overlap portion, said tab portions being defined by at least one notch cut part-way through the width of said strip, each tab having a length "$L_t$," which is less than $L_s$ and a width "$W_t$" which is less than $W_s$, such that $W_t$ plus $W_o$ equals $W_s$;
    a plurality of photovoltaic devices, each affixed to a corresponding one of said tabs and each including a positive electrode, a negative electrode, and a body of photovoltaic material disposed there between, each device operative to generate a flow of electrical current between said electrodes in response to the absorption of photons by said body of photovoltaic materials;
    a interconnect system for establishing electrical communication between said plurality of photovoltaic devices; and
    a positive electrical terminal and a negative electrical terminal disposed on a bottom surface of said roofing member and in electrical communication with the plurality of photovoltaic devices.

2. A roofing member as in claim 1, wherein said strip of roofing material comprises a body of fibrous material embedded in a matrix of an organic, polymeric material.

3. A roofing member as in claim 2, wherein said organic, polymeric matrix comprises asphalt.

4. A roofing member as in claim 2, wherein said fibrous material comprises glass fibers.

5. A roofing member as in claim 1, wherein at least some of said tab portions include a stiffening member disposed proximate a free edge thereof.

6. A roofing member as in claim 1, wherein at least some of said tabs include a body of a sealant material disposed upon a bottom side thereof.

7. A roofing member as in claim 1, wherein each of said photovoltaic devices includes a body of encapsulant material disposed to cover a light incident surface thereof.

8. A roofing member as in claim 7, wherein said photovoltaic devices each include a body of encapsulant material disposed upon a rear surface thereof.

9. A roofing member as in claim 7, wherein said encapsulant is a fluoropolymer.

10. A roofing member as in claim 1, wherein said plurality of photovoltaic devices comprises a plurality of flexible, thin film, photovoltaic devices.

11. A roofing member as in claim 1, wherein said body of photovoltaic material includes at least one layer of a silicon-hydrogen alloy material.

12. A roofing member as in claim 1, wherein said body of photovoltaic material includes at least one triad comprised of a layer of substantially intrinsic semiconductor material interposed between oppositely doped layers of semiconductor material.

13. A roofing member as in claim 1, wherein said interconnect system includes a plurality of electrically conductive jumper wires for establishing electrical communication between said plurality of photovoltaic devices.

14. A roofing member as in claim 1, wherein said interconnect system is operative to establish a series electrical connection between said plurality of photovoltaic devices.

15. A roofing member as in claim 1, wherein said interconnect system is operative to establish a parallel electrical connection between said plurality of photovoltaic devices.

16. A roofing member as in claim 1, wherein said interconnect system is operative to establish a mixed series-parallel interconnection between said photovoltaic devices.

17. A photovoltaic roofing member comprising:

a strip of roofing material having a length "$L_s$" and a width "$W_s$," said strip including an overlap portion having a length "$L_o$" which is equal to $L_s$ and a width "$W_o$," which is less than $W_s$, said strip including a plurality of tab portions depending from the overlap portion, said tab portions being defined by a plurality of notches cut part-way through the width of said strip, at least one of said notches being a tapered notch having a variable width "$W_s$"; each tab having a length "$L_t$" which is less than $L_s$ and a width "$W_t$" which is less than $W_s$, such that $W_t$ plus $W_o$ equals $W_s$;

a plurality of photovoltaic devices, each affixed to a corresponding one of said tabs and each including a positive electrode; a negative electrode, and a body of photovoltaic material disposed there between, each device operative to generate a flow of electrical current between said electrodes in response to the absorption of photons by said body of photovoltaic material;

an interconnect system for establishing electrical communication between said plurality of photovoltaic devices; and a positive electrical terminal and a negative electrical terminal in electrical communication with the plurality of photovoltaic devices.

18. A roofing member as in claim 17, wherein said tapered notch includes a root end and a free end, and said free end defines two spaced apart corners, a first one of said corners defining a right angle, and a second one of said corners defining an acute angle.

19. A roofing member as in claim 17, wherein said tapered notch includes a root end and a free end, and said free end defines two spaced apart corners, each of said corners defining an acute angle.

20. A roofing member as in claim 17, wherein the width $W_n$ is greatest proximate a root end thereof and smallest proximate a free end thereof.

* * * * *